United States Patent
Bu et al.

(10) Patent No.: US 7,512,499 B1
(45) Date of Patent: Mar. 31, 2009

(54) SYSTEM AND METHOD FOR DETERMINING SUBSTRATE DOPING DENSITY IN METAL OXIDE SEMICONDUCTOR DEVICES

(75) Inventors: Jiankang Bu, Windham, ME (US); William S. Belcher, Cape Elizabeth, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 11/643,143

(22) Filed: Dec. 20, 2006

(51) Int. Cl.
*G01N 31/00* (2006.01)
*G01N 9/36* (2006.01)
*G06F 19/00* (2006.01)
*G06F 15/00* (2006.01)

(52) U.S. Cl. .................. 702/23; 702/137
(58) Field of Classification Search .............. 702/23, 702/137; 257/392; 438/291, 301
See application file for complete search history.

(56) References Cited

U.S. PATENT DOCUMENTS

| 4,456,879 | A | 6/1984 | Kleinknecht |
| 6,472,233 | B1 | 10/2002 | Ahmed et al. |
| 6,573,120 | B2 * | 6/2003 | Jung et al. ............... 438/78 |

OTHER PUBLICATIONS

EECS 143 Microfabrication Technology, "Device Characterization," http://microlab.berkeley.edu/ee143/Characterization, Aug. 23, 2006, 39 pages.

Donald S. Wu, "Extraction of Average Doping Density and Junction Depth in an Ion-Implanted Deep-Depletion Transistor," IEEE Transactions on Electron Devices, vol. ED-27, No. 5, May 1980, pp. 995-997.

John R. Hauser, "Extraction of Experimental Mobility Mobility Data for MOS Devices," IEEE Transactions on Electron Devices, vol. 43, No. 11, Nov. 1996, pp. 1981-1988.

Semi Draft Document 4210, "New Standard: Test Method for Effective Work Function Extraction in Oxide and High-K Gate Stacks Using the MIS Flat Band Voltage-Insulator Thickness Technique," Aug. 25, 2005, 16 pages.

Mustafa G. Guvench, "Automated Measurement of MOS Capacitance and Determination of MOS Process Parameters in The MicroFabrication Laboratory," Proceedings of ASEE'97, The Annual Conference of American Society for Engineering Education, Milwaukee, WI, Jun. 25-30, 1997, 6 pages.

Richard I. Levin, "Statistics for Management," Fourth Edition, 1987, pp. 517-522.

Dieter K. Schroder, "Semiconductor Material Device Characterization," 2nd Edition, 1990, 5 pages.

* cited by examiner

*Primary Examiner*—Michael P Nghiem

(57) ABSTRACT

A system and method are disclosed for very accurately determining a value of a substrate doping density in a metal oxide semiconductor device. A plurality of values of threshold voltage of a device under test are measured using a plurality of different values of source to substrate bias voltage. Then a linear relationship is determined between the plurality of values of threshold voltage and a plurality of different values of an expression that is a function of the source to substrate bias voltage and a function of a surface potential of the device. A very accurate value of the substrate doping density is reiteratively calculated from the linear relationship without assuming that the surface potential of the device has a constant value.

21 Claims, 3 Drawing Sheets

SYSTEM AND METHOD FOR DETERMINING SUBSTRATE DOPING DENSITY IN METAL OXIDE SEMICONDUCTOR DEVICES

TECHNICAL FIELD OF THE INVENTION

The present invention is generally directed to the manufacture of integrated circuits and, in particular, to a system and method for determining with high precision a substrate doping density in metal oxide semiconductor (MOS) devices.

BACKGROUND OF THE INVENTION

A metal oxide semiconductor field effect transistor (MOSFET) device is a semiconductor device in which a gate dielectric layer electrically insulates a channel region of a semiconductor body from an overlying gate electrode. The channel region extends between a source region and a drain region of the transistor. The substrate region or the substrate (sometimes referred to as the body) is manufactured having an opposite conductivity type than the source and drain.

The charge carriers for an n-channel MOSFET are electrons. The charge carriers for a p-channel MOSFET are holes. The charge carriers move from the source region through the channel region to the drain region when appropriate voltages are applied to the gate electrode, and to the source region and to the substrate region.

Substrate doping density (designated $N_a$) is a key parameter that affects the on and off states of a MOSFET device. Due to the importance and widespread use of MOSFET devices in the integrated circuit (IC) industry, several prior art methods have been proposed that measure the substrate doping density $N_a$. The measured value of the substrate doping density $N_a$ in turn predicts the characteristics and operating performance of the MOSFET devices.

One prior art method is the electromechanical capacitance-voltage method (sometimes referred to as the ECV method). The ECV method is based upon an analysis of the capacitance-voltage characteristics of metal oxide semiconductor (MOS) capacitance. The ECV method is described in a book by Dieter K. Schroder entitled "Semiconductor Material Device Characterization", Second Edition, pp. 79-82, John Wiley & Sons, New York, 1990.

The ECV method determines the substrate doping density $N_a$ by electrolytically etching the semiconductor between capacitance measurements. However, the ECV method is destructive because it etches a hole in the semiconductor sample. For MOSFET devices, the polysilicon and the gate oxide layers have to be removed before beginning to perform the ECV method. Furthermore, following the well and channel implant procedures, MOSFET devices will often experience additional manufacturing steps such as Lightly Doped Drain (LDD) implant steps and high temperature deposition steps. These additional manufacturing steps make the substrate doping density $N_a$ appear to have different values compared to the substrate doping density $N_a$ of a MOSFET capacitor.

A second prior art method determines the doping profile in epitaxial layers of semiconductor devices. This method measures the conductivity variation originated from a photocurrent that is generated by a laser beam striking an epitaxial layer of the device. This method is described in U.S. Pat. No. 4,456,780 issued to Hans P. Kleinknecht on Jun. 26, 1984. However, the Kleinknecht method is inconvenient and inaccurate for MOSFET devices.

A third prior art method for measuring the substrate doping density $N_a$ of MOSFET devices utilizes the relationship between MOSFET threshold voltage ($V_{TH}$) and the source to substrate (body) bias voltage ($V_{SB}$). For a MOSFET device with a bias voltage $V_{SB}$ applied between the source and the substrate, the threshold voltage $V_{TH}$ is given by the expression:

$$V_{TH} = V_{TO} + \lambda(\sqrt{V_{SB}+\phi_S} - \sqrt{\phi_S}) \qquad \text{Eq. (1)}$$

where $V_{TO}$ is the threshold voltage when $V_{SB}$ is zero and where $\phi_S$ is the surface potential. The coefficient $\lambda$ is the body-bias coefficient that is determined by the expression:

$$\lambda = \frac{\sqrt{2\varepsilon_{SI} q N_a}}{C_{OX}} \qquad \text{Eq. (2)}$$

where the expression $C_{OX}$ is the gate oxide capacitance. The value of the gate oxide capacitance $C_{OX}$ is readily available for the device being tested using well-established capacitance-voltage measurements or inline gate oxide thickness measurements. The substrate doping density is represented by the expression $N_a$. The expression $\varepsilon_{SI}$ represents the permittivity of silicon. The letter q represents the charge of an electron.

A linear relationship exists between the threshold voltage $V_{TH}$ and the expression $\sqrt{V_{SB}+\phi_S} - \sqrt{\phi_S}$. Therefore, the third prior art method is able to obtain a value for the substrate doping density $N_a$ by using the following procedure:

1. Measure $V_{TH}$ using different values of $V_{SB}$.
2. Generate a set of data points of $V_{TH}$ versus $\sqrt{V_{SB}+\phi_S} - \sqrt{\phi_S}$ using an estimated value of $\phi_S$.
3. Plot the data points on a graph to determine the linear relationship between $V_{TH}$ and $\sqrt{V_{SB}+\phi_S} - \sqrt{\phi_S}$.
4. Draw a best fit straight line through the plotted values of $V_{TH}$ versus the values of $\sqrt{V_{SB}+\phi_S} - \sqrt{\phi_S}$.
5. Calculate the y-intercept $V_{TO}$ and the slope $\lambda$.
6. Then calculate the value of the substrate doping density $N_a$ by placing the value of $\lambda$ in Equation (2) and solving Equation (2) for the value of $N_a$.

This third prior art method treats the value of the surface potential $\phi_S$ as a constant. This constant $\phi_S$ is taken to be approximately seven tenths of a volt (0.7 V).

In reality the value of the surface potential $\phi_S$ actually depends upon the value of the substrate doping density $N_a$ in accordance with the following relationship:

$$\phi_S = 2\frac{kT}{q}\ln\left(\frac{N_a}{n_i}\right) \qquad \text{Eq. (3)}$$

where the letter k represents the Boltzmann constant, and the letter T represents the temperature, and letter q represents the charge of an electron, and the expression $n_i$ represents the intrinsic carrier density in silicon.

The prior art methods that determine the value of the substrate doping density $N_a$ by assuming a constant value for the surface potential $\phi_S$ are bound to create erroneous results. This is because the surface potential $\phi_S$ is actually dependent on the value of the substrate doping density $N_a$ (as seen in Equation (3)).

Therefore, there is a need in the art for a system and method that is capable of obtaining a precise and accurate measurement of substrate doping density $N_a$ in a MOSFET device. In particular, there is a need in the art for a system and a method that can obtain more precise and accurate measurements of substrate doping density $N_a$ in a MOSFET device by taking into account the fact that the value of the surface potential $\phi_S$ is not a constant but is dependent on the value of the substrate doping density $N_a$ of the MOSFET device.

BRIEF SUMMARY OF THE INVENTION

The present invention provides an improved system and method that determines a highly accurate value of the substrate doping density $N_a$ in a MOSFET device. An advantageous embodiment of the method of the present invention begins with the measurement of a set of values of threshold voltage $V_{TH}$ for various values of the source to substrate (body) bias voltage $V_{SB}$ for the MOSFET device that is being tested. An estimated initial value of the substrate doping density $N_a$ is selected for the purpose of a first iteration of calculation.

The method then calculates a value of the surface potential $\phi_S$ from the value of the substrate doping density $N_a$. Then a set of data points of $V_{TH}$ versus the expression $\sqrt{V_{SB}+\phi_S}-\sqrt{\phi_S}$ is generated using the calculated value of the surface potential $\phi_S$. The values are then plotted and a least squares method is used to obtain a linear relationship between the values. A best fit straight line is drawn through the plotted values of $V_{TH}$ versus the values of $\sqrt{V_{SB}+\phi_S}-\sqrt{\phi_S}$.

Then the value of the y-intercept $V_{TO}$ and the value of the slope $\lambda$ of the line are determined and used to determine a more precise value for the substrate doping density $N_a$. The method continues to perform subsequent iterations until the value of the substrate doping density $N_a$ is less than a predetermined resolution value. Then the final value of the substrate doping density $N_a$ is reported.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
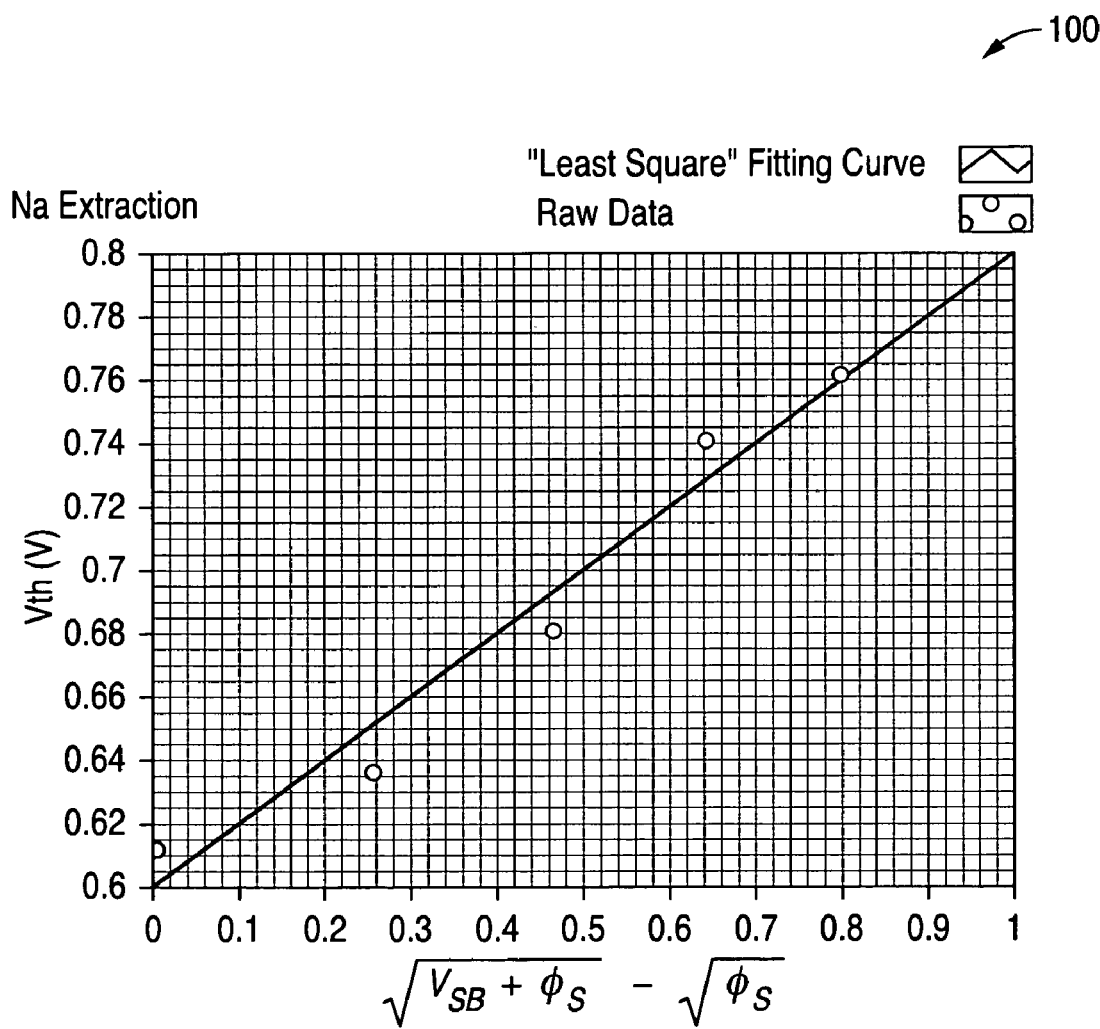
FIG. 1 illustrates a graph showing a linear relationship between data points of $V_{TH}$ and values of the expression $\sqrt{V_{SB}+\phi_S}-\sqrt{\phi_S}$ in accordance with the principles of the present invention.
Figure 2:
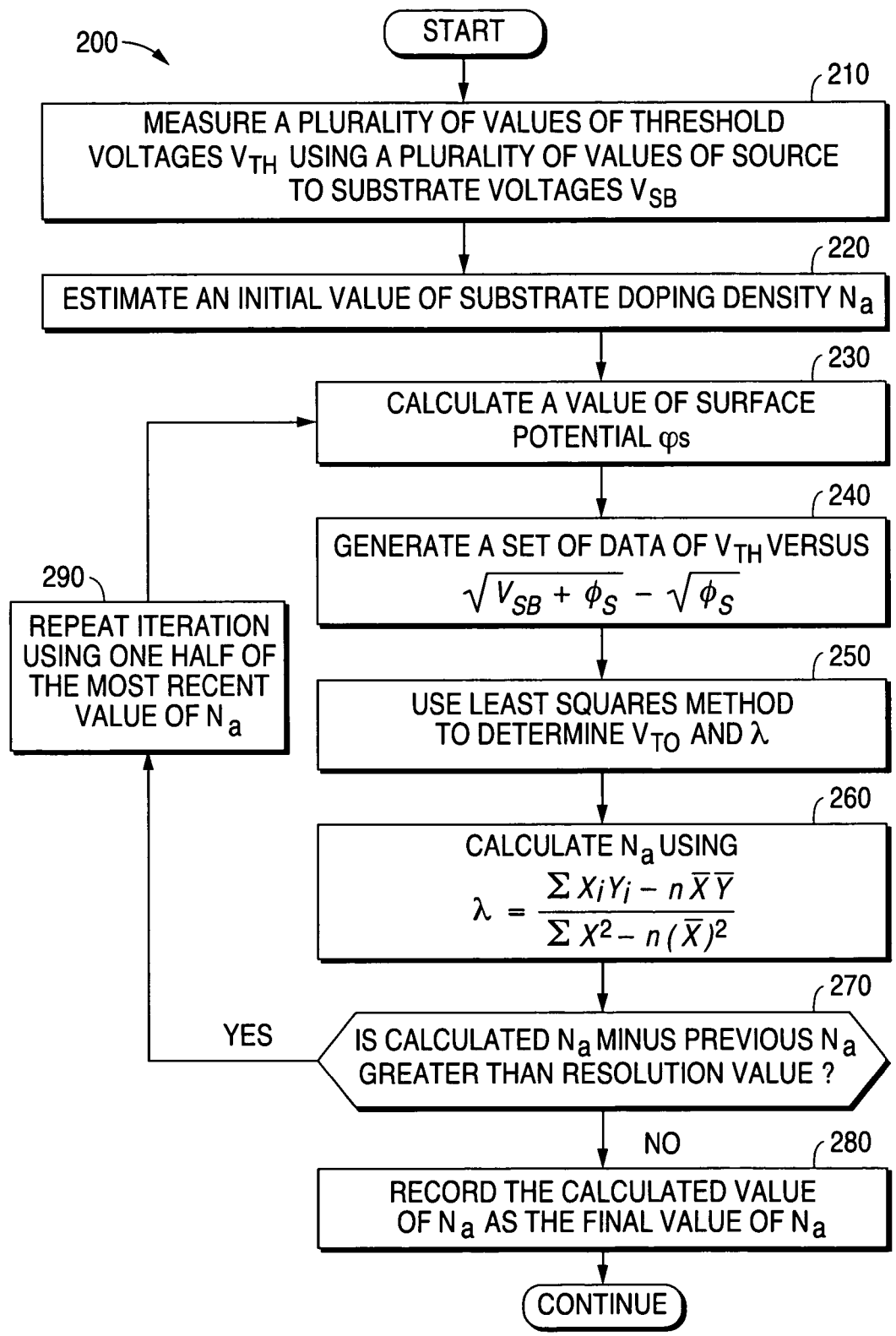
FIG. 2 illustrates a flow chart showing the steps of a first advantageous embodiment of a method of the present invention.
Figure 3:
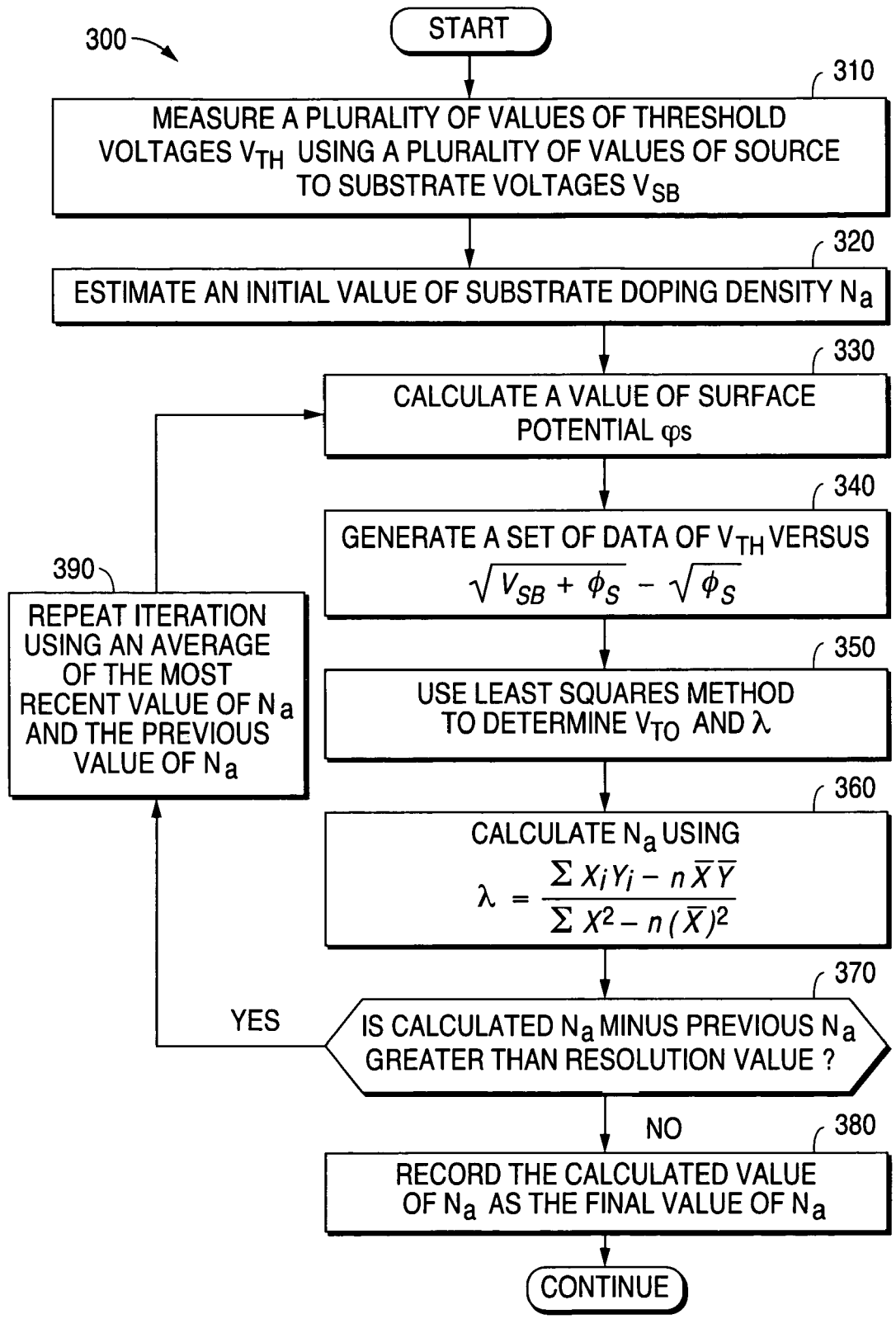
FIG. 3 illustrates a flow chart showing the steps of a second advantageous embodiment of a method of the present invention.

FIGS. 1 through 3, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged metal oxide semiconductor field effect transistor (MOSFET) device.

As previously mentioned, the prior art approach assumes that the value of the surface potential $\phi_S$ is constant. This assumption of the prior art simplifies the calculation by making it easier to solve Equation (1). For convenient reference, Equation (1) is $$V_{TH}=V_{TO}+\lambda(\sqrt{V_{SB}+\phi_S}-\sqrt{\phi_S}) \quad \text{Eq. (1)}$$

However, this simplifying assumption also decreases the precision with which the value of the substrate doping density $N_a$ can be calculated. As will be more fully described below, the method of the present invention calculates a precise value for the substrate doping density $N_a$ without approximating the value of the surface potential $\phi_S$ as a constant.

In the first step of an advantageous embodiment of the method of the invention, a plurality of values of threshold voltages $V_{TH}$ of the MOSFET device being tested are measured using a plurality of source to substrate (body) voltages $V_{SB}$. The data points can be represented as $(V_{TH}\text{-}1,V_{SB}\text{-}1)$, $(V_{TH}\text{-}2,V_{SB}\text{-}2), (V_{TH}\text{-}3,V_{SB}\text{-}3), \ldots, (V_{TH}\text{-}N,V_{SB}\text{-}N)$ where N is the number of data point pairs.

An estimated initial value of the substrate doping density $N_a$ is then selected for the purpose of a first iteration of calculation. An initial value of approximately $10^{18}$ carriers per cubic centimeter ($cm^3$) would work as a high value.

Then the initial value of the substrate doping density $N_a$ is used to calculate a value of the surface potential $\phi_S$ using Equation (3). For convenient reference, Equation (3) is $$\phi_S = 2\frac{kT}{q}\ln\left(\frac{N_a}{n_i}\right) \quad \text{Eq. (3)}$$

Then a set of data points of $V_{TH}$ versus the expression $\sqrt{V_{SB}+\phi_S}-\sqrt{\phi_S}$ is generated using the calculated value of the surface potential $\phi_S$. The values are then plotted and a "least squares" method is used to obtain a linear relationship between the values of $V_{TH}$ and the values of the expression $\sqrt{V_{SB}+\phi_S}-\sqrt{\phi_S}$. A best fit straight line is drawn through the plotted values of threshold voltage $V_{TH}$ versus the values of the expression $\sqrt{V_{SB}+\phi_S}-\sqrt{\phi_S}$.

FIG. 1 illustrates a graph 100 showing a linear relationship between data points of $V_{TH}$ and values of the expression $\sqrt{V_{SB}+\phi_S}-\sqrt{\phi_S}$ in accordance with the principles of the present invention. As shown in FIG. 1, the y-axis is the vertical axis that shows the values of threshold voltage $V_{TH}$ in volts (V). The x-axis is the horizontal axis that shows the values of the expression $\sqrt{V_{SB}+\phi_S}-\sqrt{\phi_S}$.

The value of the y-intercept $V_{TO}$ and the value of the slope $\lambda$ of the best fit straight line are then obtained. From Equation (1), the y-axis intercept (when the expression $\sqrt{V_{SB}+\phi_S}-\sqrt{\phi_S}$ equals zero) gives the threshold voltage value $V_{TO}$. In order to minimize error during the linear fitting of data, the method of the present invention employs a "least squares" method to obtain the best fit straight line that relates the threshold voltage data $V_{TH}$ and the $\sqrt{V_{SB}+\phi_S}-\sqrt{\phi_S}$ data.

The "least squares" method minimizes the error between the points of the fitted line and the actually observed data points. For more information on the "least squares" method one may consult a book by Richard I. Levin entitled "Statistics For Management", Fourth Edition, pp. 517-522, Prentice Hall, Englewood Cliffs, N.J., 1987.

For a series of $(X_i, Y_i)$ data, the slope of the best fitting straight line is given by the expression $$\lambda = \frac{\sum X_i Y_i - n\overline{X}\,\overline{Y}}{\sum X^2 - n(\overline{X})^2} \qquad \text{Eq. (4)}$$

where X is the value of the independent variable and Y is the value of the independent variable. The expression $\overline{X}$ is the mean of the values of the independent variable. The expression $\overline{Y}$ is the mean of the values of the dependent variable. The letter "n" represents the number of pairs of data. The intercept of the best fitting straight line is $\overline{Y} - \lambda \overline{X}$.

With respect to the method of the present invention the independent variable X is $\sqrt{V_{SB}+\phi_S} - \sqrt{\phi_S}$ and the dependent variable Y is $V_{TH}$. The value of the slope $\lambda$ of the best fit straight line is calculated from Equation (4).

The value of the slope $\lambda$ of the best fit straight line represents the value of the body bias coefficient $\lambda$ given in Equation (2). For convenient reference, Equation (2) is $$\lambda = \frac{\sqrt{2\varepsilon_{SI} q N_a}}{C_{OX}} \qquad \text{Eq. (2)}$$

Then the value of the substrate doping density $N_a$ is calculated by placing the value of $\lambda$ into Equation (2) and solving Equation (2) for the value of $N_a$. Then the newly calculated value of the substrate doping density $N_a$ from Equation (2) is compared to the previous value of substrate doping density $N_a$ (or to the initial value of $N_a$ for the first iteration).

If the difference between the two values of substrate doping density $N_a$ is greater than a preselected resolution value, then a new iteration value of substrate doping density $N_a$ is selected and the method performs another iteration beginning at the step in which a value of the surface potential $\phi_S$ is calculated. In one advantageous embodiment of the present invention, the new iteration value of substrate doping density $N_a$ for the next iteration is equal to one half of the most recent value of substrate doping density $N_a$ (i.e., the most recently calculated value of substrate doping density $N_a$).

If the difference between the two values of substrate doping density $N_a$ is less than a preselected resolution value, then the most recently calculated value of the substrate doping density $N_a$ is recorded as the final value of substrate doping density $N_a$. In one advantageous embodiment of the method, the preselected resolution value may be as high as two hundredths of one percent (0.02%).

FIG. 2 illustrates a flow chart 200 showing the steps of a first advantageous embodiment of a method of the invention. First, a plurality of values of threshold voltages $V_{TH}$ of the MOSFET device being tested are measured using a plurality of source to substrate (body) voltages $V_{SB}$ (step 210). Then an initial value of substrate doping density $N_a$ is estimated (step 220). Then a value of surface potential $\phi_S$ is calculated from Equation (3) (step 230). Then a set of data points of threshold voltage $V_{TH}$ versus the expression $\sqrt{V_{SB}+\phi_S} - \sqrt{\phi_S}$ is generated using the calculated value of the surface potential $\phi_S$ (step 240).

Then the values are plotted and a "least squares" method is used to obtain a linear relationship between the values. A best fit straight line is drawn through the plotted values of $V_{TH}$ versus the values of $\sqrt{V_{SB}+\phi_S} - \sqrt{\phi_S}$. The "least squares" method is used to determine the values of the y-intercept $V_{TO}$ and the slope $\lambda$ (step 250). Then the value of the substrate doping density $N_a$ is calculated by placing the value of $\lambda$ into Equation (2) and solving Equation (2) for the value of $N_a$ (step 260).

Then the newly calculated value of the substrate doping density $N_a$ from Equation (2) is compared to the previous value of substrate doping density $N_a$ (or to the initial value of $N_a$ for the first iteration) (decision step 270). If the difference between the two values of substrate doping density $N_a$ is greater than a preselected resolution value, then a new iteration value of substrate doping density $N_a$ is selected to be a value that is equal to one half of the most recent value of the substrate doping density $N_a$ (step 290). Then the control for the next iteration passes to step 230 and the steps of the method continue.

If the difference between the two values of substrate doping density $N_a$ is less than a preselected resolution value (decision step 270), then the most recently calculated value of the substrate doping density $N_a$ is recorded as the final value of substrate doping density $N_a$ (step 280).

In another advantageous embodiment of a method of the invention, a new iteration value of the substrate doping density Na for a next iteration may be selected to be a value that is equal to the most recent value of the substrate doping density Na plus a fixed increment value. An example of such a fixed increment value is $10^{13}$ carriers per cubic centimeter ($cm^3$).

In MOSFET devices, the value of the substrate doping density $N_a$ may vary from $10^{14}$ carriers per cubic centimeter ($cm^3$) to $10^{18}$ carriers per cubic centimeter ($cm^3$). This represents a large range of four (4) orders of magnitude. For such a large range the iteration process of the present method could take a prohibitively long time to complete using a fixed increment value.

For example, assume that the actual value of the substrate doping density $N_a$ of the sample is $10^{18}$ carriers per cubic centimeter ($cm^3$). If the initial value for the substrate doping density $N_a$ is selected to be $10^{14}$ carriers per cubic centimeter ($cm^3$), then the method would require $10^5$ iterations (i.e., 100,000 iterations) in order to complete the process using a fixed increment value of $10^{13}$ carriers per cubic centimeter ($cm^3$).

To overcome the possibility of requiring long calculation times, a second advantageous embodiment of the method of the invention selects a new iteration value of substrate doping density $N_a$ for iteration by using a value that is equal to the average value of the most recent value of the substrate doping density $N_a$ and the previous value of the substrate doping density $N_a$. The average value is obtained by adding together the most recent value of the substrate doping density $N_a$ and the previous value of the substrate doping density $N_a$ and dividing the sum by two.

The calculation time for the method is significantly reduced when the average value of the two substrate doping densities $N_a$ is used instead of a fixed increment value. If the fixed increment value method takes N iterations to complete, then the average value method takes only $\text{Log}_2(N)$ iterations to complete. For the example mentioned above, the average value method would require only sixteen (16) iterations instead of one hundred thousand (100,000) iterations.

FIG. 3 illustrates a flow chart 300 showing the steps of a second advantageous embodiment of a method of the invention. First, a plurality of values of threshold voltages $V_{TH}$ of the MOSFET device being tested are measured using a plurality of source to substrate (body) voltages $V_{SB}$ (step 2310). Then an initial value of substrate doping density $N_a$ is estimated (step 320). Then a value of surface potential $\phi_S$ is calculated from Equation (3) (step 330). Then a set of data points of threshold voltage $V_{TH}$ versus the expression $\sqrt{V_{SB}+\phi_S}-\sqrt{\phi_S}$ is generated using the calculated value of the surface potential $\phi_S$ (step 340).

Then the values are plotted and a "least squares" method is used to obtain a linear relationship between the values. A best fit straight line is drawn through the plotted values of $V_{TH}$ versus the values of $\sqrt{V_{SB}+\phi_S}-\sqrt{\phi_S}$. The "least squares" method is used to determine the values of the y-intercept $V_{TO}$ and the slope $\lambda$ (step 350). Then the value of the substrate doping density $N_a$ is calculated by placing the value of $\lambda$ into Equation (2) and solving Equation (2) for the value of $N_a$ (step 360).

Then the newly calculated value of the substrate doping density $N_a$ from Equation (2) is compared to the previous value of substrate doping density $N_a$ (or to the initial value of $N_a$ for the first iteration) (decision step 370). If the difference between the two values of substrate doping density $N_a$ is greater than a preselected resolution value, then a new iteration value of substrate doping density $N_a$ is selected to be a value that is equal to an average of the most recent value of the substrate doping density $N_a$ and the previous value of the substrate doping density $N_a$ (step 390). Then the control for the next iteration passes to step 330 and the steps of the method continue.

If the difference between the two values of substrate doping density $N_a$ is less than a preselected resolution value (decision step 370), then the most recently calculated value of the substrate doping density $N_a$ is recorded as the final value of substrate doping density $N_a$ (step 380).

The method of the present invention was tested experimentally using n-channel metal oxide semiconductor (NMOS) transistors having dimensions of 0.44 micron by 0.40 micron. The resulting extracted value of substrate doping density $N_a$ was $3.07 \times 10^{16}$ carriers per cubic centimeter ($cm^3$). The threshold voltage $V_{TO}$ was 0.56 volt. When the iterations of the method of the invention converged on the extracted value of $3.07 \times 10^{16}$ carriers per cubic centimeter ($cm^3$), the difference between the sequential values was only $4.9 \times 10^{12}$ carriers per cubic centimeter ($cm^3$). This represents a resolution of approximately two hundredths of one percent (0.02%).

In modern MOSFET devices, the substrate doping density $N_a$ varies along the length of the channel depending on the existence of source and drain side implants, halo implants and other features of device architecture. The method of the present invention gives an average value of the substrate doping density $N_a$ along the channel as seen while the MOSFET device is operating. This feature of the method of the invention is convenient for MOSFET device level applications.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for determining a value of a substrate doping density in a metal oxide semiconductor device, said method comprising the steps of:

measuring a plurality of values of threshold voltage of said device using a plurality of different values of source to substrate bias voltage of said device;

determining a linear relationship between said plurality of values of threshold voltage and a plurality of different values of an expression that is a function of said source to substrate bias voltage and a function of a surface potential of said device; and determining a value of said substrate doping density from said linear relationship by reiteratively calculating the value of said substrate doping density using said linear relationship while taking into account that said surface potential of said device is a function of said substrate doping density.

2. The method as claimed in claim 1 wherein said value of substrate doping density is determined by:

obtaining a value of a body bias coefficient of said device from said linear relationship; and calculating a value of said substrate doping density using said value of said body bias coefficient of said device.

3. The method as claimed in claim 2 wherein said value of said body bias coefficient is equal to a slope of a best fit straight line of said linear relationship.

4. The method as claimed in claim 2 wherein said expression that is a function of said source to substrate bias voltage and a function of a surface potential of said device is $$\sqrt{V_{SB}+\phi_S}-\sqrt{\phi_S}$$

where $V_{SB}$ represents said source to substrate bias voltage and where $\phi_S$ represents said surface potential of said device.

5. A method for determining a value of a substrate doping density in a metal oxide semiconductor device, said method comprising the steps of:

measuring a plurality of values of threshold voltage of said device using different values of source to substrate bias voltage of said device;

determining a linear relationship between said plurality of values of threshold voltage and a plurality of different values of an expression that is a function of said source to substrate bias voltage and a function of a surface potential of said device;

determining a value of said substrate doping density from said linear relationship without assuming that said surface potential of said device has a constant value, wherein said value of said substrate doping density is determined by:

obtaining a value of a body bias coefficient of said device from said linear relationship;

calculating a value of said substrate doping density using said value of said body bias coefficient of said device;

comparing a difference between said calculated value of said substrate doping density and a previous value of said substrate doping density with a resolution value; and reporting said calculated value of said substrate doping density as a final value of said substrate doping density when said difference is less than said resolution value.

6. The method as claimed in claim 5 further comprising the step of:

reiteratively calculating another value of said substrate doping density when said difference is greater than said resolution value.

7. The method as claimed in claim 6 wherein said step of reiteratively calculating another value of said substrate doping density comprises the steps of:

selecting an iteration value of said substrate doping density by modifying said calculated value of said substrate doping density; and using said iteration value of said substrate doping density to calculate another value of said surface potential for a next iteration.

8. The method as claimed in claim 7 wherein said step of selecting an iteration value of said substrate doping density by modifying said calculated value of said substrate doping density comprises the step of adding a fixed increment value of substrate doping density to said calculated value of said substrate doping density.

9. The method as claimed in claim 7 wherein said step of selecting an iteration value of said substrate doping density by modifying said calculated value of said substrate doping density comprises the step of selecting an iteration substrate doping density value that is one half of said calculated value of said substrate doping density.

10. The method as claimed in claim 7 wherein said step of selecting an iteration value of said substrate doping density by modifying said calculated value of said substrate doping density comprises the step of selecting an iteration substrate doping density value that is equal to an average of said calculated value of said substrate doping density and the previous value of said substrate doping density.

11. A method for determining a value of a substrate doping density in a metal oxide semiconductor device, said method comprising the steps of:

measuring a plurality of values of threshold voltage of said device using a plurality of different values of source to substrate bias voltage of said device;

determining a linear relationship between said plurality of values of threshold voltage and a plurality of different values of an expression that is a function of said source to substrate bias voltage and a function of a surface potential of said device; and reiteratively calculating a value of said substrate doping density using said linear relationship while taking into account that said surface potential of said device is a function of said substrate doping density.

12. The method as claimed in claim 11 wherein said step of reiteratively calculating a value of said substrate doping density comprises the steps of:

selecting an initial value of said substrate doping density;
calculating a value of said surface potential using said selected initial value of said substrate doping density;
generating a set of data points of said linear relationship using said calculated value of said surface potential.

13. The method as claimed in claim 12 wherein said expression that is a function of said source to substrate bias voltage and a function of a surface potential of said device is $$\sqrt{V_{SB}+\phi_S}-\sqrt{\phi_S}$$

where $V_{SB}$ represents said source to substrate bias voltage and where $\phi_S$ represents said surface potential of said device; and where said set of data points of said linear relationship comprises values of said threshold voltage and values of said expression $$\sqrt{V_{SB}+\phi_S}-\sqrt{\phi_S}.$$

14. The method as claimed in claim 13 further comprising the step of:

using a least squares method to obtain a linear relationship between the values of said threshold voltage and the values of said expression $\sqrt{V_{SB}+\phi_S}-\sqrt{\phi_S}$.

15. The method as claimed in claim 14 further comprising the steps of:

obtaining a value of a body bias coefficient of said device from a slope of a best fit straight line of said linear relationship; and calculating a value of said substrate doping density using said value of said body bias coefficient of said device.

16. The method as claimed in claim 15 further comprising the steps of:

comparing said calculated value of said substrate doping density with a resolution value; and reporting said calculated value of said substrate doping density as a final value of said substrate doping density if said calculated value of said substrate doping density is less than said resolution value.

17. The method as claimed in claim 16 further comprising the step of:

reiteratively calculating another value of said substrate doping density if said calculated value of said substrate doping density is greater than said resolution value.

18. The method as claimed in claim 17 wherein said step of reiteratively calculating another value of said substrate doping density comprises the steps of:

selecting an iteration value of said substrate doping density by modifying said calculated value of said substrate doping density; and using said iteration value of said substrate doping density to calculate another value of said surface potential for a next iteration.

19. The method as claimed in claim 18 wherein said step of selecting an iteration value of said substrate doping density by modifying said calculated value of said substrate doping density comprises the step of adding a fixed increment value of substrate doping density to said calculated value of said substrate doping density.

20. The method as claimed in claim 18 wherein said step of selecting an iteration value of said substrate doping density by modifying said calculated value of said substrate doping density comprises the step of selecting an iteration substrate doping density value that is one half of said calculated value of said substrate doping density.

21. The method as claimed in claim 18 wherein said step of selecting an iteration value of said substrate doping density by modifying said calculated value of said substrate doping density comprises the step of selecting an iteration substrate doping density value that is equal to an average of said calculated value of said substrate doping density and a previous value of said substrate doping density.

* * * * *

UNITED STATES PATENT AND TRADEMARK OFFICE
CERTIFICATE OF CORRECTION

| | |
|---|---|
| PATENT NO. | : 7,512,499 B1 |
| APPLICATION NO. | : 11/643143 |
| DATED | : March 31, 2009 |
| INVENTOR(S) | : Bu et al. |

It is certified that error appears in the above-identified patent and that said Letters Patent is hereby corrected as shown below:

Column 1, line 43, delete "1990" and replace with --1998--.

Signed and Sealed this

Sixteenth Day of March, 2010

David J. Kappos
*Director of the United States Patent and Trademark Office*